United States Patent
Beaupre et al.

(10) Patent No.: US 8,232,637 B2
(45) Date of Patent: Jul. 31, 2012

(54) INSULATED METAL SUBSTRATES INCORPORATING ADVANCED COOLING

(75) Inventors: Richard Alfred Beaupre, Pittsfield, MA (US); Peter Almern Losee, Clifton Park, NY (US); Xiaochun Shen, Schenectady, NY (US); John Stanley Glaser, Niskayuna, NY (US); Joseph Lucian Smolenski, Slingerlands, NY (US); Adam Gregory Pautsch, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 427 days.

(21) Appl. No.: 12/433,301

(22) Filed: Apr. 30, 2009

(65) Prior Publication Data
US 2010/0277868 A1     Nov. 4, 2010

(51) Int. Cl.
*H01L 23/34*     (2006.01)
(52) U.S. Cl. ........ 257/713; 257/714; 257/723; 257/717; 361/676; 361/677; 361/688; 361/820; 361/831
(58) Field of Classification Search .................. 257/685, 257/686, 678, 714, 717, 723, 724, 726; 361/601, 361/676, 677, 688, 689, 692, 698, 699, 700, 361/717, 730, 820, 831
See application file for complete search history.

(56) References Cited

U.S. PATENT DOCUMENTS

| | | | |
|---|---|---|---|
| 5,513,072 A | 4/1996 | Imaji et al. | |
| 6,344,686 B1 | 2/2002 | Schaeffer et al. | |
| 7,417,857 B2 | 8/2008 | Rondier et al. | |
| 7,518,236 B2 * | 4/2009 | Delgado et al. | 257/723 |
| 2003/0062149 A1 * | 4/2003 | Goodson et al. | 165/104.11 |
| 2003/0085024 A1 * | 5/2003 | Santiago et al. | 165/104.11 |
| 2003/0164231 A1 * | 9/2003 | Goodson et al. | 165/104.11 |
| 2004/0032275 A1 * | 2/2004 | Cader et al. | 324/760 |
| 2004/0089442 A1 * | 5/2004 | Goodson et al. | 165/104.11 |
| 2004/0188132 A1 | 9/2004 | Borrego Bel et al. | |
| 2005/0098299 A1 * | 5/2005 | Goodson et al. | 165/80.3 |
| 2005/0173380 A1 * | 8/2005 | Carbone | 219/121.31 |
| 2005/0205241 A1 * | 9/2005 | Goodson et al. | 165/80.4 |
| 2005/0254214 A1 * | 11/2005 | Salmon | 361/699 |
| 2007/0080360 A1 * | 4/2007 | Mirsky et al. | 257/99 |
| 2007/0103868 A1 * | 5/2007 | Yazawa | 361/699 |
| 2008/0137308 A1 * | 6/2008 | MacDonald et al. | 361/720 |
| 2009/0008064 A1 | 1/2009 | Nicole et al. | |
| 2009/0072770 A1 * | 3/2009 | Son et al. | 318/139 |
| 2009/0127685 A1 * | 5/2009 | Jong et al. | 257/676 |
| 2010/0187682 A1 * | 7/2010 | Pinjala et al. | 257/713 |

OTHER PUBLICATIONS

Schutze, J.; Ilgen, H.; Fahrner, W.R., An integrated micro cooling system for electronic circuits, Industrial Electronics, IEEE Transactions on, vol. 48, Issue 2, Apr. 2001, pp. 281-285.

* cited by examiner

*Primary Examiner* — Telly Green
(74) *Attorney, Agent, or Firm* — Scott J. Asmus

(57) ABSTRACT

A power module includes one or more semiconductor power devices bonded to an insulated metal substrate (IMS). A plurality of cooling fluid channels is integrated into the IMS.

8 Claims, 5 Drawing Sheets

INSULATED METAL SUBSTRATES INCORPORATING ADVANCED COOLING

BACKGROUND

This invention relates generally to semiconductor power modules, more particularly, to semiconductor power modules that employ an insulated metal substrate (IMS).

The development of higher-density power electronics has made it increasingly more difficult to cool power semiconductor devices. With modern silicon-based power devices capable of dissipating up to 500 W/cm$^2$, there is a need for improved thermal management solutions. When device temperatures are limited to 50 K increases, natural and forced air cooling schemes can only handle heat fluxes up to about one (1) W/cm$^2$. Conventional liquid cooling plates can achieve heat fluxes on the order of twenty (20) W/cm$^2$. Heat pipes, impingement sprays, and liquid boiling are capable of larger heat fluxes, but these techniques can lead to manufacturing difficulties and high cost.

An additional problem encountered in conventional cooling of high heat flux power devices is non-uniform temperature distribution across the heated surface. This is due to the non-uniform cooling channel structure, as well as the temperature rise of the cooling fluid as it flows through long channels parallel to the heated surface.

One promising technology for high performance thermal management is micro-channel cooling. In the 1980's, it was demonstrated as an effective means of cooling silicon integrated circuits, with designs demonstrating heat fluxes of up to 1000 W/cm$^2$ and surface temperature rises below 100° C. Known micro-channel designs require soldering a substrate (with micro-channels fabricated in the bottom copper layer) to a metal-composite heat sink that incorporates a manifold to distribute cooling fluid to the micro-channels. These known micro-channel designs employ very complicated backside micro-channel structures and heat sinks that are extremely complicated to build and therefore very costly to manufacture.

Some power electronics packaging techniques have also incorporated milli-channel technologies in substrates and heatsinks. These milli-channel techniques generally use direct bond copper (DBC) or active metal braze (AMB) substrates to improve thermal performance in power modules.

It would be desirable to provide a power electronics packaging technique that further advances state of the art power module thermal performance while simultaneously providing superior electrical functionality characteristics than that achievable using known micro-channel, DBC and AMB power electronics packaging techniques.

BRIEF DESCRIPTION

Briefly, in accordance with one embodiment, a power module comprises:
an insulated metal substrate (IMS) comprising a single cooling fluid channel or a plurality of cooling fluid channels integrated therein; and
at least one semiconductor power device bonded to the IMS.

According to another embodiment, a power module comprises:
at least one semiconductor power device;
an insulated metal substrate (IMS) bonded to the at least one semiconductor power device, the IMS comprising a single cooling fluid channel or a plurality of cooling fluid channels integrated therein; and
a heatsink mounted to the IMS, the heatsink comprising a manifold array configured to provide coolant flow through heatsink inlet and outlet plenums to cool the at least one semiconductor power device via the plurality of cooling fluid channels.

According to still another embodiment, a power module comprises:
an insulated metal substrate (IMS) comprising:
a circuit layer comprising an insulator material including metallized circuitry integrated therein and a plurality of thermal vias disposed there through;
an insulator layer comprising a first surface bonded to a first surface of the circuit layer; and
a metal base layer bonded to a second surface of the insulator layer opposite the first surface of the insulator layer, the metal base layer comprising a single cooling fluid channel or a plurality of cooling fluid channels integrated therein; and
at least one semiconductor power device bonded to a second surface of the circuit layer opposite the first surface of the circuit layer.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
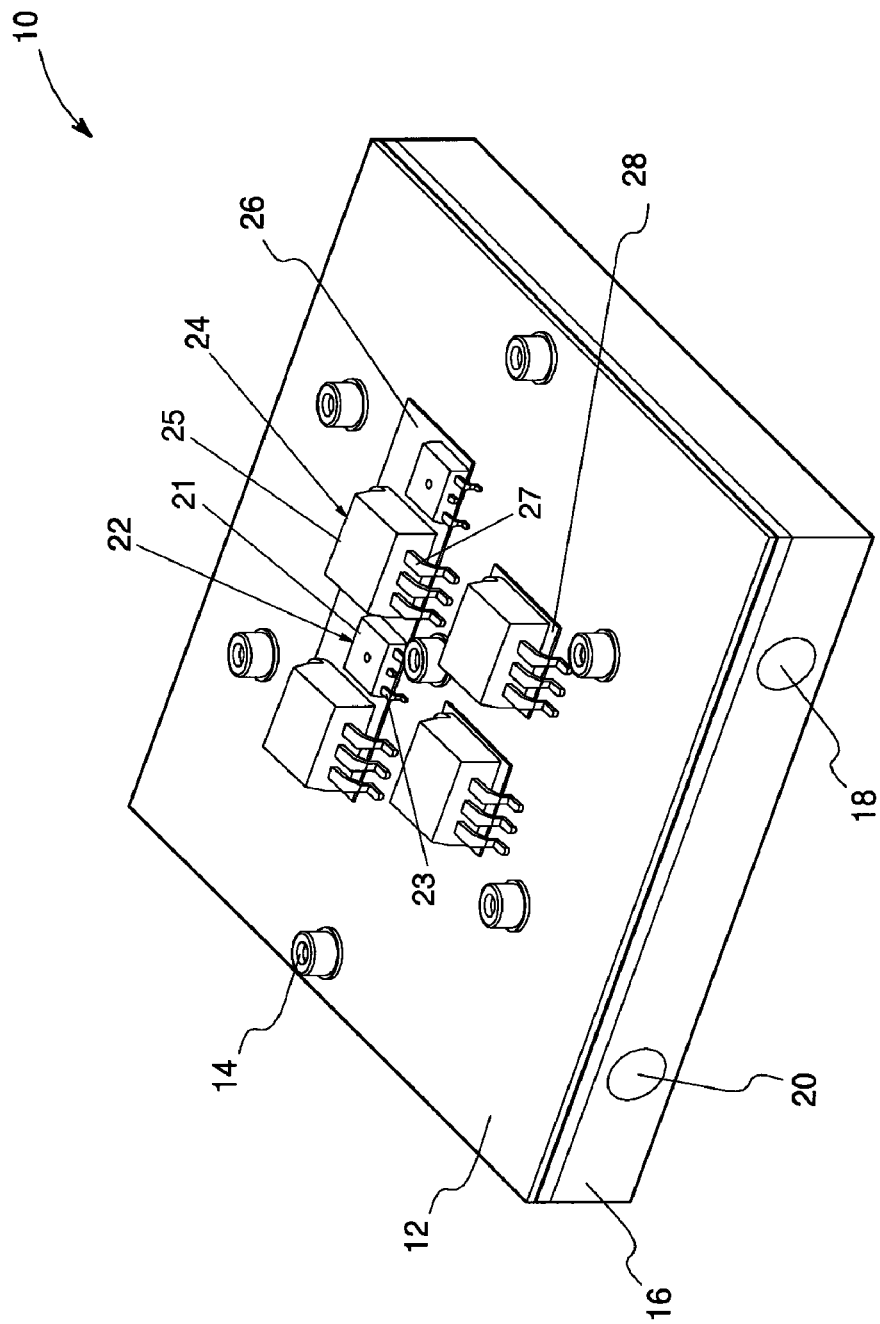
FIG. 1 is a perspective view illustrating a semiconductor power module that includes an insulated metal substrate (IMS) and a heatsink according to one embodiment of the present invention.

FIG. 1 is a perspective view illustrating a semiconductor power module 10 that includes an insulated metal substrate (IMS) 12 and a heatsink 16 according to one embodiment of the present invention. According to one embodiment, semiconductor power module 10 also includes one or more TO-252 power semiconductors 22 and one or more TO-263 power semiconductors 24. Each power semiconductor 22 comprises a case 21 with external contacts 23. Each power semiconductor 24 comprises a case 25 with external contacts 27. The power semiconductors 22, 24 are bonded to corresponding thermal vias 26, 28 integrated into the IMS 12, described in further detail below. It can be seen from FIG. 1 that only the case of each power semiconductor 22, 24 is bonded to thermal vias 26, 28, while the external contacts 23, 27 are spaced apart from the thermal vias 26, 28.

A plurality of fasteners 14 assists in aligning and securing the IMS 12 to the heatsink 16. The heatsink 16, described in further detail below, includes a cooling fluid inlet port 18 and a cooling fluid outlet port 20. According to one aspect, the heatsink 16 is attached via pressurized sealing to a metal base layer of the IMS 12. The metal base layer described in further detail below may consist of, without limitation, copper, aluminum, other metals, or plastic.

Figure 2:
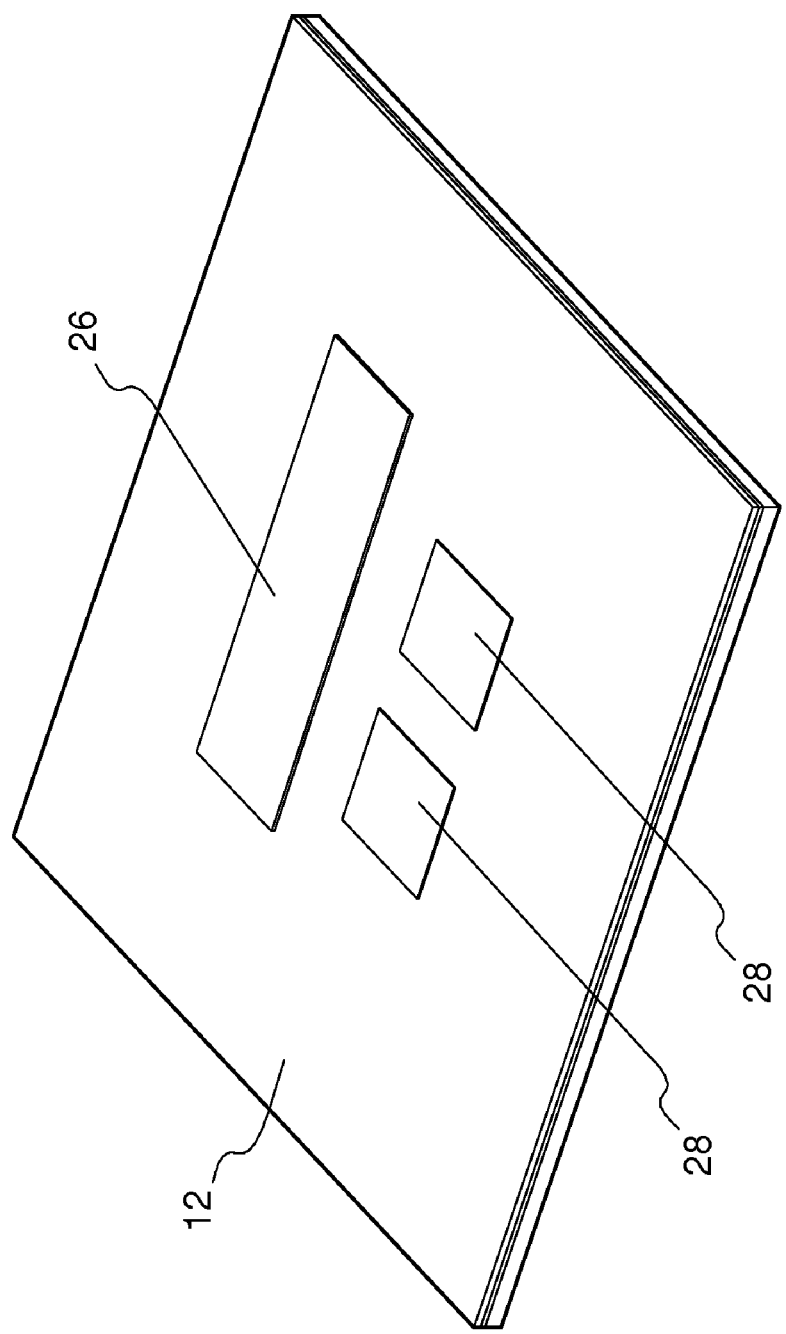
FIG. 2 is a perspective view illustrating the IMS depicted in FIG. 1.

FIG. 2 is a perspective view illustrating the IMS 12 depicted in FIG. 1, and includes thermal vias 26, 28 integrated into a top circuit layer described further herein. According to one embodiment, the IMS 12 is constructed using a Thermal-clad (T-clad) construction technique that includes a top circuit layer bonded to a dielectric/insulator layer bonded to a base layer. One T-clad IMS 12 that provides a workable solution is available from the Bergquist Company, having corporate headquarters and manufacturing facilities located at 18930 W. 78$^{th}$ Street, Chanhassen, Minn. 56317. Another embodiment IMS 12 is implemented using a T-lam construction technique that provides a workable solution and is available from Laird Technologies.

Figure 3:
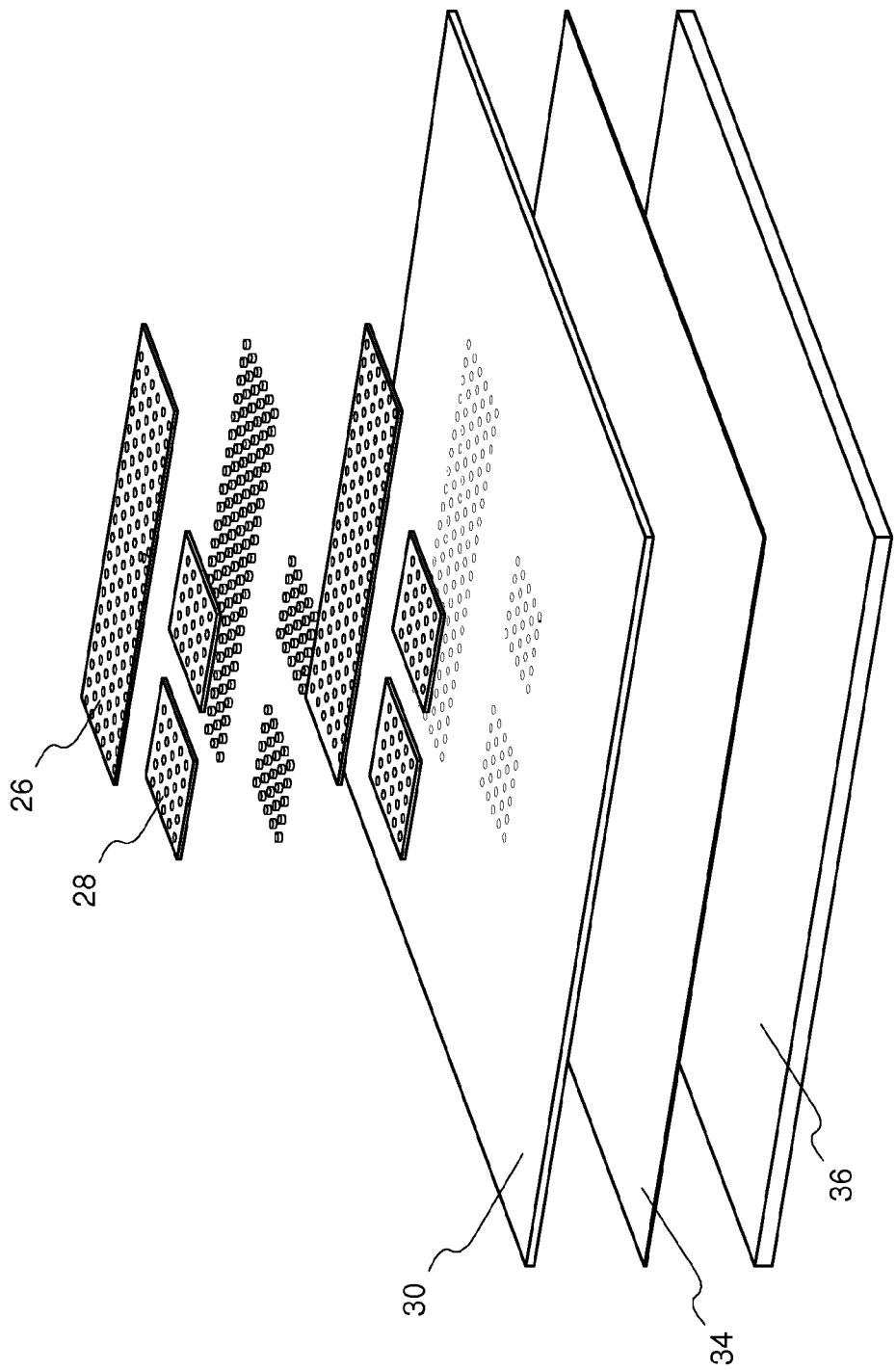
FIG. 3 is a perspective view illustrating in greater detail, the IMS depicted in FIG. 2.

FIG. 3 is a perspective view illustrating in greater detail, the IMS 12 depicted in FIG. 2 and available from the Bergquist Company. According to one aspect, the top circuit layer 30 is copper and can include multiple layers. The dielectric/insulator layer 34 bonded to the top circuit layer 30 according to one embodiment comprises a ceramic particle filled polymer layer that has a relatively low thermal conductivity. Layer 34 functions to provide a low thermal resistance from the circuit layer (30) to the metal layer (36) of copper or aluminum.

A base metal layer 36 such as copper or aluminum is bonded to the opposite side of the dielectric/insulator layer 34. Other similar dielectric materials may also be employed so long as the dielectric material can be bonded with the metalized top and bottom layers 30, 36. Thermal vias 26, 28 pass through multiple layers and operate to transfer heat away from the multiple top circuit 30 layers. It is clear from the pattern of thermal vias 26, 28 illustrated in FIG. 3 that a plurality of thermal vias are bonded to each power semiconductor device case 21, 25 shown in FIG. 1.

Figure 4:
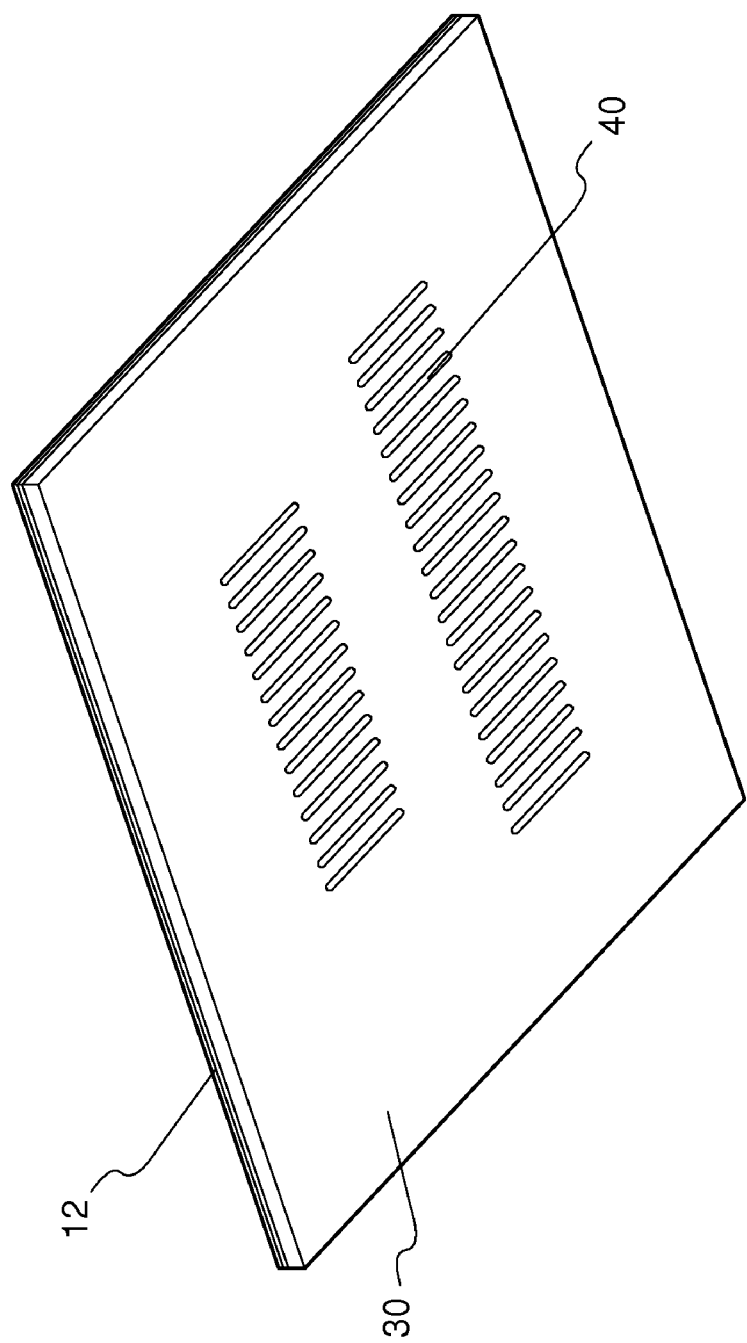
FIG. 4 is a perspective view illustrating in greater detail, the baseplate portion of the IMS depicted in FIG. 2.

FIG. 4 is a perspective view illustrating in greater detail, the baseplate 36 of the IMS 12 depicted in FIG. 2. According to one embodiment of the invention, baseplate 36 is modified to now include cooling fluid channels 40 such as milli-channels or micro-channels integrated therein. The IMS 12 with cooling fluid channels 40 is then mounted or attached to the heatsink 16 described in further detail below with reference to FIG. 5. The heatsink 16 incorporates inlet and outlet plena and associated manifolds to deliver liquid coolant to the cooling fluid channels 40 in the IMS 12 and remove heated coolant from the IMS 12. The result is an IMS power module 10 that has higher thermal performance. Further, since the IMS 12 can be fabricated with several electrical interconnect layers, greater electrical functionality can be incorporated on the insulated metal substrate closer to the power/switching semiconductor devices 22, 24.

The baseplate layer 36 may comprise channel geometries that encompass micro-channel dimensions to milli-channel dimensions. Channels 40 may have, for example, a feature size of about 0.05 mm to about 5.0 mm according to some aspects of the invention. Exemplary channel configurations may be formed of continuous micro-channels extending along the baseplate 36. According to another embodiment, channels 40 are about 0.1 mm wide and are separated by a number of gaps of about 0.2 mm. According to yet another embodiment, channels 40 are about 0.3 mm wide and are separated by a number of gaps of about 0.5 mm. According to still another embodiment, channels 40 are about 0.6 mm wide and are separated by a number of gaps of about 0.8 mm.

Figure 5:
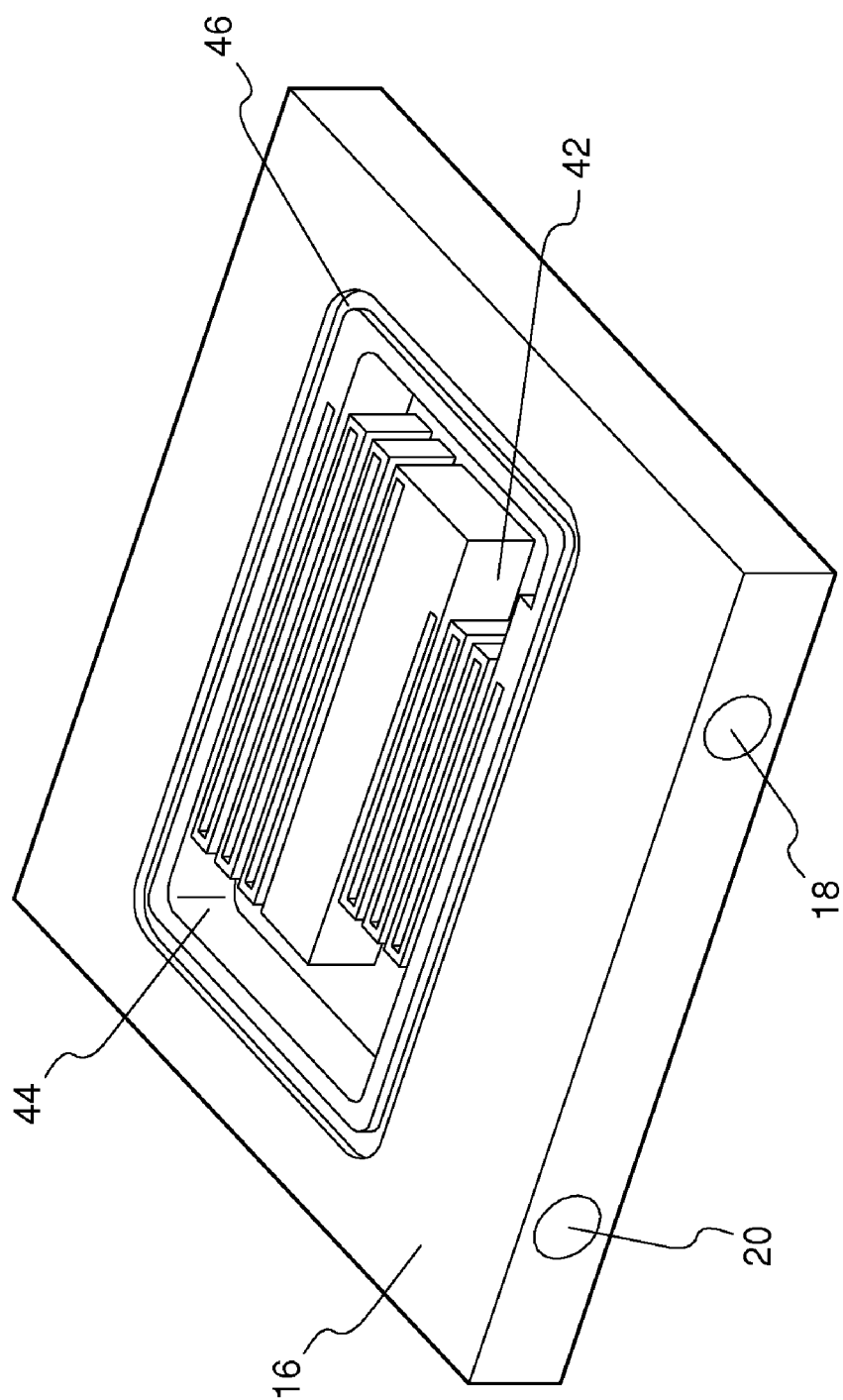
FIG. 5 is a perspective view illustrating in greater detail, the heatsink depicted in FIG. 1.

FIG. 5 is a perspective view illustrating in greater detail, the heatsink 16 depicted in FIG. 1. Heatsink 16 defines an inlet manifold plenum 42 and an outlet manifold plenum 44. The inlet manifold plenum 42 is configured to receive a coolant via a fluid inlet port 18, and the outlet manifold plenum 44 is configured to exhaust the coolant via a fluid outlet port 20. In one embodiment the inlet and outlet manifolds are interleaved. Channels 40 within baseplate layer 36 may be oriented substantially perpendicular to the heatsink inlet and outlet manifolds according to one aspect of the invention. This structure provides a simple assembly process, which reduces the overall cost of the heat sink assembly 16. According to one aspect, an O-ring groove 46 accepts a corresponding compressible O-ring or epoxy bead that operates to seal the IMS 12 to the heatsink 16.

Baseplate 36 provides fluid passages 40 in close proximity to the power device 22, 24 surface(s), enabling practical and cost effective implementation of the channel cooling technology; while heatsink 16 includes fluidic passages that are perpendicular to fluid passages 40 within with the baseplate layer 36 according to one embodiment. Since heatsink 16 is only required to provide a means to transfer cooling fluid, heatsink 16 need not be constructed from a metal that is necessarily suitable to provide a means of heat transfer. Effective heat transfer process is instead achieved from the bonds between the baseplate 36, the dielectric/insulator layer 34 and the top circuit layer 30.

Heatsink plenum passages are larger in cross-section than that associated with the channel layer channels 40 according to one aspect of the invention in order to provide a desired high level of cooling capacity for the corresponding heat sink assembly. Many coolants can be employed for heat sink, and the embodiments are not limited to a particular coolant. Exemplary coolants include water, ethylene-glycol, propylene-glycol, oil, aircraft fuel and combinations thereof. According to some embodiments, the coolant comprises a single phase liquid, a multi-phase liquid, or a slurry mixture containing microencapsulated particles, phase change particles, or other materials. In operation, the coolant enters the channels 40 via heatsink inlet port 18 and flows through baseplate layer 16 channels 40 before returning via heatsink outlet port 20.

In summary explanation, a semiconductor device power module 10 includes an insulated metal substrate 12 in contrast to direct bond copper or active metal braze substrates presently employed in semiconductor device power modules. The insulated metal substrate 12 employs cooling fluid cooling channels comprising channel geometries that encompass micro-channel dimensions to milli-channel dimensions. The insulated metal substrate 12 is mounted to a heatsink that incorporates inlet and outlet plena and associated manifolds to deliver liquid coolant to the cooling channels in the insulated metal substrate 12 and remove heated coolant from the insulated metal substrate 12. The resultant insulated metal substrate semiconductor device power module 10 has higher thermal performance than that achievable with traditional semiconductor device power modules using direct bond copper or active metal braze substrates.

Incorporation of cooling liquid onto the aluminum or copper substrate contained within the insulated metal substrate 12 reduces thermal resistance paths and can increase thermal performance by at least four to five times over that achievable with conventional IMS packages that bond the IMS to a liquid heatsink using an intermediate layer of thermal grease or thermal interface material.

Table I illustrates thermal resistance differences between power modules incorporating different substrate structures according to particular power module embodiments. The thermal resistance in °C./W corresponding to a power module using a conventional mounting is 0.470. The thermal resistance in °C./W corresponding to a power module using an insulated metal substrate with integrated milli-channel structure is only 0.243. These differences are even greater when compared to a conventional IMS mounting as shown in Table I below. The highest performance is achieved by integrating cooling channels into the DBC.

TABLE I

| Design | R (°C./W) | Notes |
| --- | --- | --- |
| Commercial DBC Module | 0.470 | Module bonded to 4 pass heatsink using thermal interface layer |
| Integrated Millichannel | 0.094 | Module DBC bonded to millichannel heatsink |
| IMS on Coldplate | 1.066 | IMS bonded to 4 pass heatsink using thermal interface material |
| IMS w/ Integrated Millichannel | 0.243 | |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power module comprising:
    an insulated metal substrate (IMS) comprising:
        a circuit layer comprising an insulator material including metallized circuitry integrated therein and a first plurality of thermal vias disposed there through;
        an insulator layer comprising a first surface bonded to a first surface of the circuit layer; and
        a metal base layer bonded to a second surface of the insulator layer opposite the first surface of the insulator layer, the metal base layer comprising a plurality of cooling fluid channels integrated therein; and
    at least one semiconductor power device bonded to a second surface of the circuit layer opposite the first surface of the circuit layer; wherein each semiconductor power device comprises a corresponding case with external electrical contacts, and further wherein each semiconductor power device case abuts a corresponding plurality of thermal vias selected from within the first plurality of thermal vias, and further wherein the first plurality of thermal vias are spaced apart from the semiconductor power device external electrical contacts.

2. The power module according to claim 1, further comprising a heatsink mounted to the IMS, the heatsink comprising a manifold array configured to provide coolant flow through heatsink inlet and outlet plenums to cool the at least one semiconductor power device via the plurality of cooling fluid channels.

3. The power module according to claim 1, wherein the cooling channels comprise micro-channel dimensions to milli-channel dimensions.

4. The power module according to claim 1, wherein the base layer comprises aluminum or copper.

5. The power module according to claim 1, wherein the top circuit layer comprises a plurality of circuit path layers.

6. The power module according to claim 2, wherein the heatsink comprises a moldable, castable or machinable material.

7. The power module according to claim 2, further comprising a compressible seal disposed between the IMS and the heatsink, the compressible seal operating to prevent leakage of cooling fluid from the power module.

8. The power module according to claim 2, wherein the mounted heatsink is configured to transfer a single phase or multi-phase liquid coolant to and from the IMS.

* * * * *